(12) United States Patent
Jain

(10) Patent No.: US 6,549,451 B2
(45) Date of Patent: Apr. 15, 2003

(54) MEMORY CELL HAVING REDUCED LEAKAGE CURRENT

(76) Inventor: Raj Kumar Jain, 66 Bayshore Road, Unit 06-06, Diamond Tower, Singapore 469985 (SG)

( * ) Notice: Subject to any disclaimer, the term of this patent is extended or adjusted under 35 U.S.C. 154(b) by 0 days.

(21) Appl. No.: 09/855,163

(22) Filed: May 14, 2001

(65) Prior Publication Data

US 2002/0167834 A1 Nov. 14, 2002

Related U.S. Application Data

(63) Continuation-in-part of application No. 09/806,299, filed on Oct. 3, 2001, which is a continuation-in-part of application No. 09/806,395, filed on Jun. 12, 2001, and a continuation-in-part of application No. 09/615,987, filed on Jul. 14, 2000, now Pat. No. 6,304,478.

(51) Int. Cl.$^7$ ................................................ G11C 11/40

(52) U.S. Cl. ........................................ 365/154; 365/156
(58) Field of Search ................................. 365/154, 156, 365/155

(56) References Cited

U.S. PATENT DOCUMENTS 4,805,148 A * 2/1989 Diehl-Nagle et al. ....... 365/154
5,774,393 A * 6/1998 Kuriyama ................... 365/156

* cited by examiner

Primary Examiner—Tan T. Nguyen
(74) Attorney, Agent, or Firm—Dexter Chin

(57) ABSTRACT

A memory cell is provided with a first access transistor coupled to a first terminal of the storage transistor and a second access transistor coupled to a second terminal of the storage transistor is disclosed. The gates of the access transistors are coupled to word lines. In the inactive state, the word lines comprise a negative voltage to reduce leakage current from the memory cell.

32 Claims, 7 Drawing Sheets

US 6,549,451 B2

MEMORY CELL HAVING REDUCED LEAKAGE CURRENT

This is a continuation-in-part of patent applications, titled: "Dual-Port Memory Cell", U.S. Ser. No. 09/806,299 filed Oct. 3, 2001; "Single-Port Memory Cell", U.S. Ser. No. 09/806,395 filed Jun. 12, 2001 and "Layout for a SemiConductor Memory", U.S. Ser. No. 09/615,987 filed Jul. 14, 2000 now U.S. Pat. No. 6,304,478.

FIELD OF THE INVENTION

The present invention relates generally to memory cells. More particularly, the invention relates to memory cells having improved retention time.

BACKGROUND OF THE INVENTION

Integrated circuits (ICs) such as digital signal processor s (DSPs) include on-chip memory to store information. The on-chip memory typically comprises, for example, an array of static random access memory (SRAM) cells connected by word lines in one direction and bit lines in another direction. The information stored in the SRAM cells are maintained until power is removed from the IC. Sense amplifiers are coupled to the bit lines to facilitate memory accesses, such as reads or writes. A sense amplifier is coupled to a pair of bit lines and senses a differential voltage indicative of the information stored in the selected memory cell on the bit line pair.

FIG. 1 shows a conventional SRAM cell 101. The SRAM cell comprises first and second transistors 110 and 120 coupled to a latch 130, which stores a bit of information. One transistor is coupled to a bit line 140 and the other is coupled to a bit line complement 141 while the gates are coupled to a word line 135. The latch includes first and second inverters 133 and 134, each implemented with two transistors. As such, the SRAM cell is realized using six transistors.

Smaller SRAM cells using less than six transistors have been proposed to reduce chip size. However, the charge stored in such cells dissipates overtime due to current leakage. To prevent the charge from dissipating below an undefined logic level (logic 0 or 1), the memory cell must be refreshed. Typically, refreshing of memory cells interrupts the normal operation, thus adversely impacting the performance of the IC.

As evidenced from the above discussion, it is desirable to provide a memory cell with improved charge retention time to decrease refresh frequency.

SUMMARY OF THE INVENTION

The present invention relates generally to memory cells. More particularly, the invention relates to reducing leakage current in memory cells. In one embodiment, the memory cell comprises a plurality of first access transistors coupled to a first terminal of a storage transistor and a second access transistor coupled to a second terminal of the storage transistor. Bit lines are coupled to the access transistors and word lines are coupled to the gates of access transistors. In one embodiment, the word lines comprise a negative voltage in the inactive state. The negative voltage reduces leakage current from the memory cell.

PREFERRED EMBODIMENTS OF THE INVENTION

Figure 1:
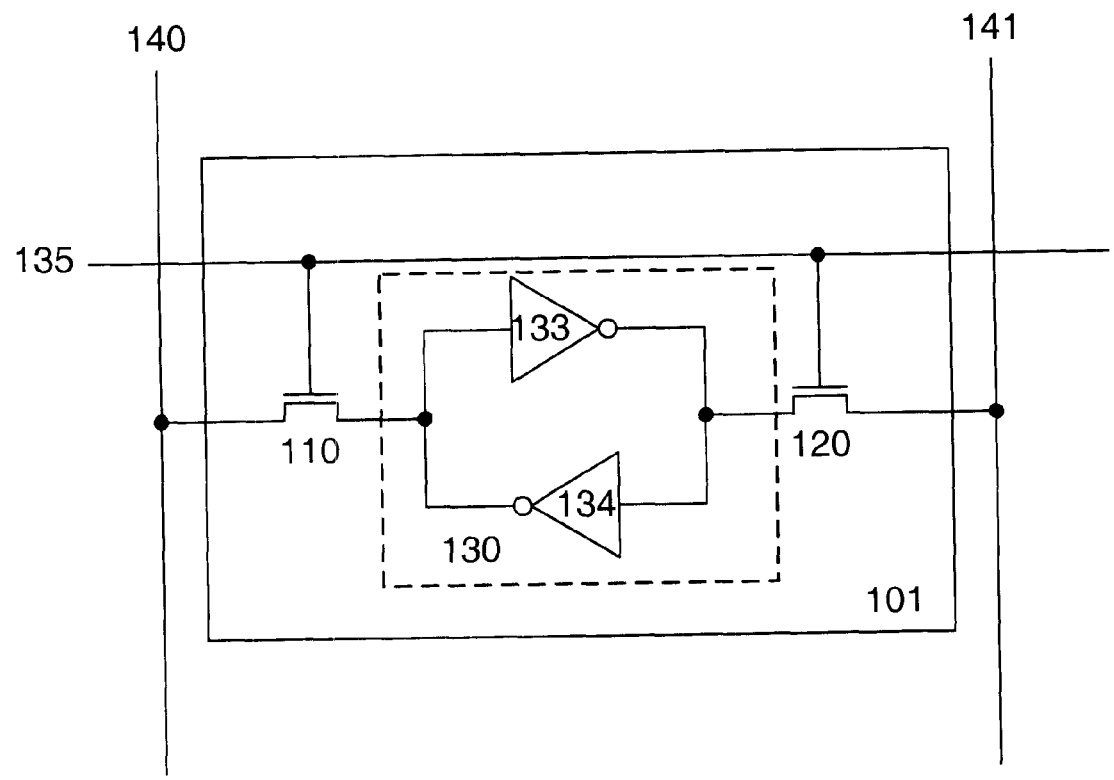
FIG. 1 shows a conventional SRAM cell.
Figure 2:
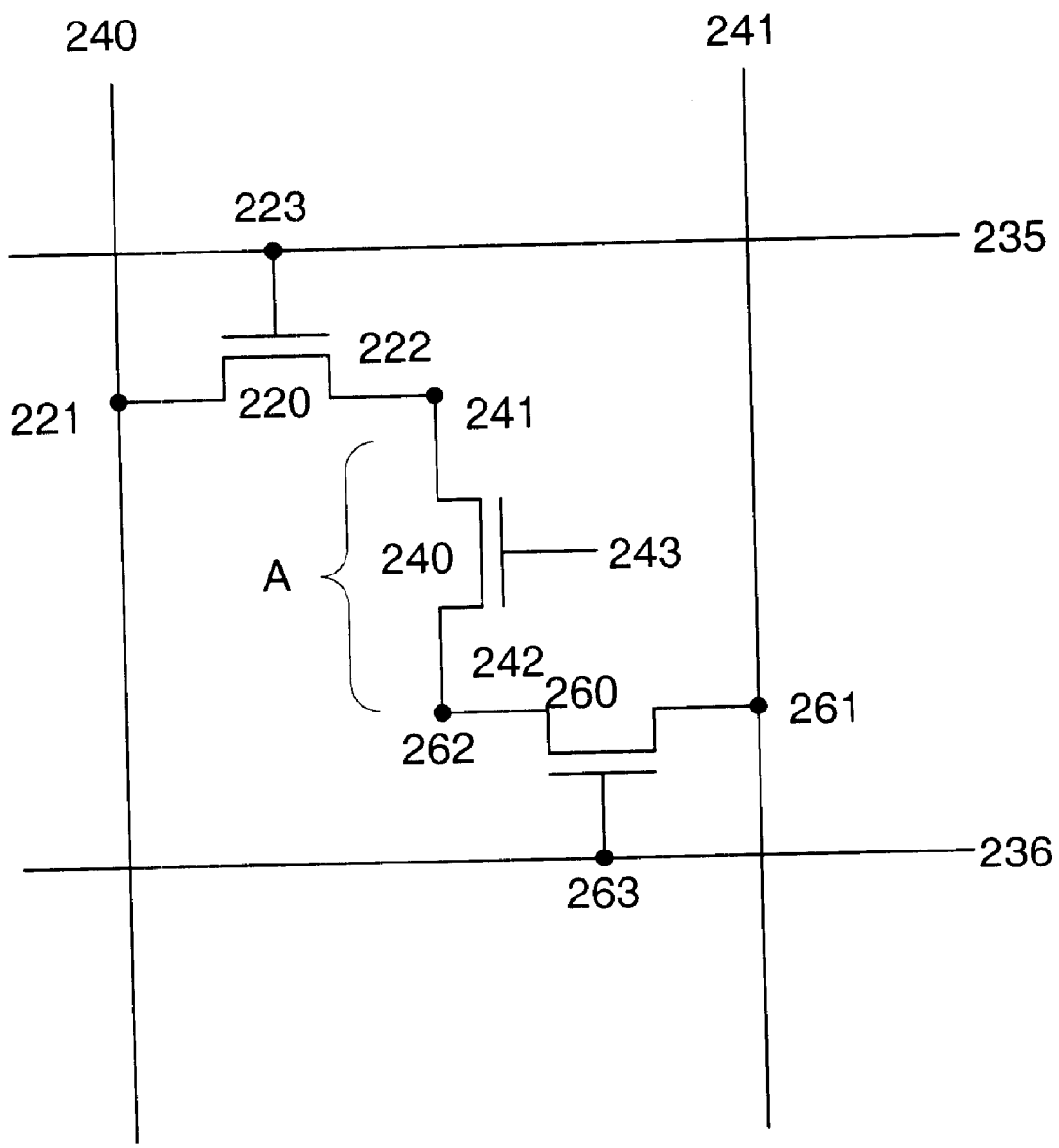
FIG. 2 shows a memory cell in accordance with one embodiment of the invention.

FIG. 2 shows a memory cell 201 in accordance with one embodiment of the invention. The memory cell comprises first and second access transistors 220 and 260 coupled in series to a storage transistor 240. The transistors, in one embodiment, are n-FETs. Implementing the memory cell with p-FETs or a combination of n and p-FETs is also useful. The access transistors serve as memory access ports, each coupled to a bit line (240 or 241) and a word line (235 or 236). In one embodiment, the first access transistor's first terminal 221 is coupled to the bit line 240 and its gate is coupled to the word line 235. Similarly, the second access transistor's first terminal 261 is coupled to bit line 241 and its gate is coupled to word line 236. The memory cell can be accessed either through the first or second port. Refreshing of the memory cell are also performed through the access ports.

Second terminals 222 and 262 of the access transistors are respectively coupled to first and second terminals 241 and 242 of the storage transistor. A gate 243 of the storage transistor is coupled to an active signal to render the transistor conductive. In one embodiment, the storage transistor is an n-FET having its gate coupled to $V_{DD}$. When power is applied to the IC, the storage transistor is rendered conductive. As a result, the first and second terminals are coupled together to form the storage node (node A). When power is removed from the IC, the first and second terminals are isolated from each other.

A memory access from the first port is performed by activating the word line 235 (e.g., logic 1) to render the first access transistor conductive. This results in, node A being coupled to the bit line via the first access transistor's first terminal 221. During a read access, the charge voltage stored at node A is transferred to the bit line. For a write access, the charge voltage on the bit line (generated by write circuitry) is transferred to node A. Accessing the second port of the memory cell is achieved by selecting the word line 236 to couple node A to the bit line 241. A refresh can be performed in the first or second port by activating the first or second word line.

In another embodiment, the first port of the memory cell serves as an access port and the second port of the memory cell serves as a dedicated refresh port from which refreshes are performed. The first port is coupled to a bit line and a word line while the refresh port is coupled to a refresh bit line and a refresh word line. The operation of such a memory cell is described in concurrently filed patent application titled: "Memory Architecture with Refresh and Sense Amplifiers", U.S. Ser. No. 09/855,147, which is herein incorporated by reference for all purposes.

Figure 3:
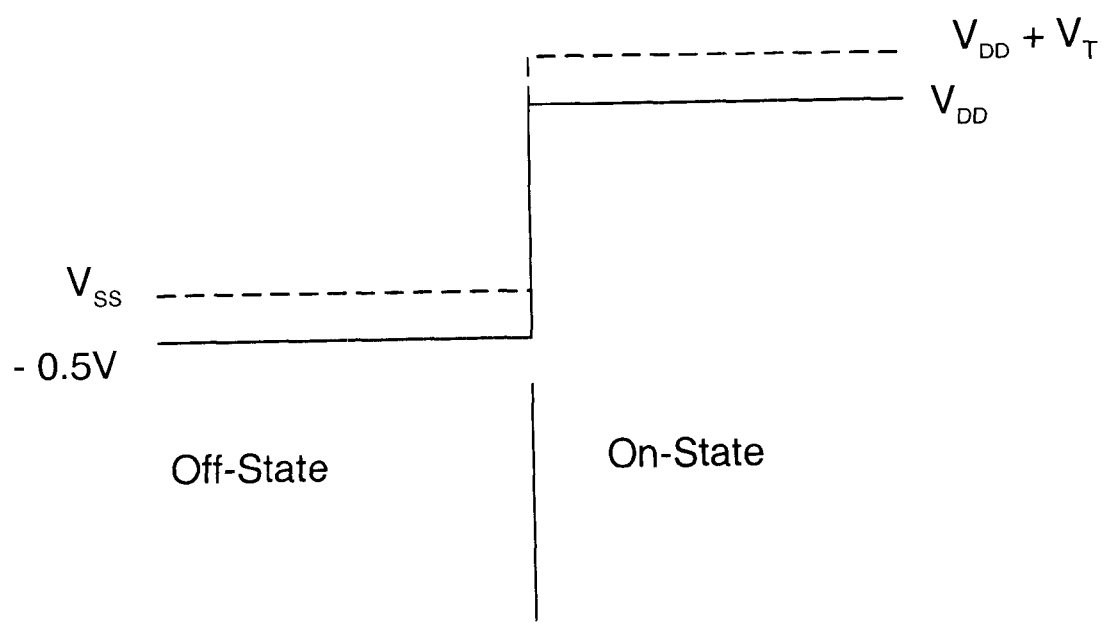
FIG. 3 shows the off-state and on-state gate voltage of the access transistor in accordance with one embodiment of the invention.

In accordance with the invention, the gate-to-source voltage of the access transistors ($V_{GSa}$) is reduced to decrease leakage current. In one embodiment $V_{GSa}$ is reduced by providing a negative off-state voltage to the gates of the access transistors. FIG. 3 shows the diagram of the gate voltage of an n-FET access transistor. To reduce $V_{GS}$, the access transistor's off-state gate voltage (logic 0) is less the $V_{SS}$ or ground (dotted line). In one embodiment, the off-state voltage is less than 0V to about −0.9V. Preferably, the off-state voltage of the access transistor is about −0.4V to −0.6V and more preferably −0.5V.

Optionally, the on-state gate voltage of the access transistor is greater than $V_{DD}$ (dotted line), where $V_{DD}$ is the operating voltage for most of the logic in the IC. In one embodiment, the on-state gate voltage is equal to or greater than about $V_{DD}+V_T$, preferably the on-state gate voltage is about $V_{DD}+V_T\Delta V$, where $\Delta V$ is, for example, about 0.1–0.3V to account for the body effect of the transistor. Providing an on-state gate voltage greater than $V_{DD}$ increases the charge stored in the node A, further increasing the retention time of the memory cell. The use of on-state gate voltage greater than $V_{DD}$ is described in concurrently filed patent application titled: "Memory Cell With Improved Retention Time", U.S. Ser. No. 09/855,167 which is herein incorporated by reference for all purposes.

Figure 4:
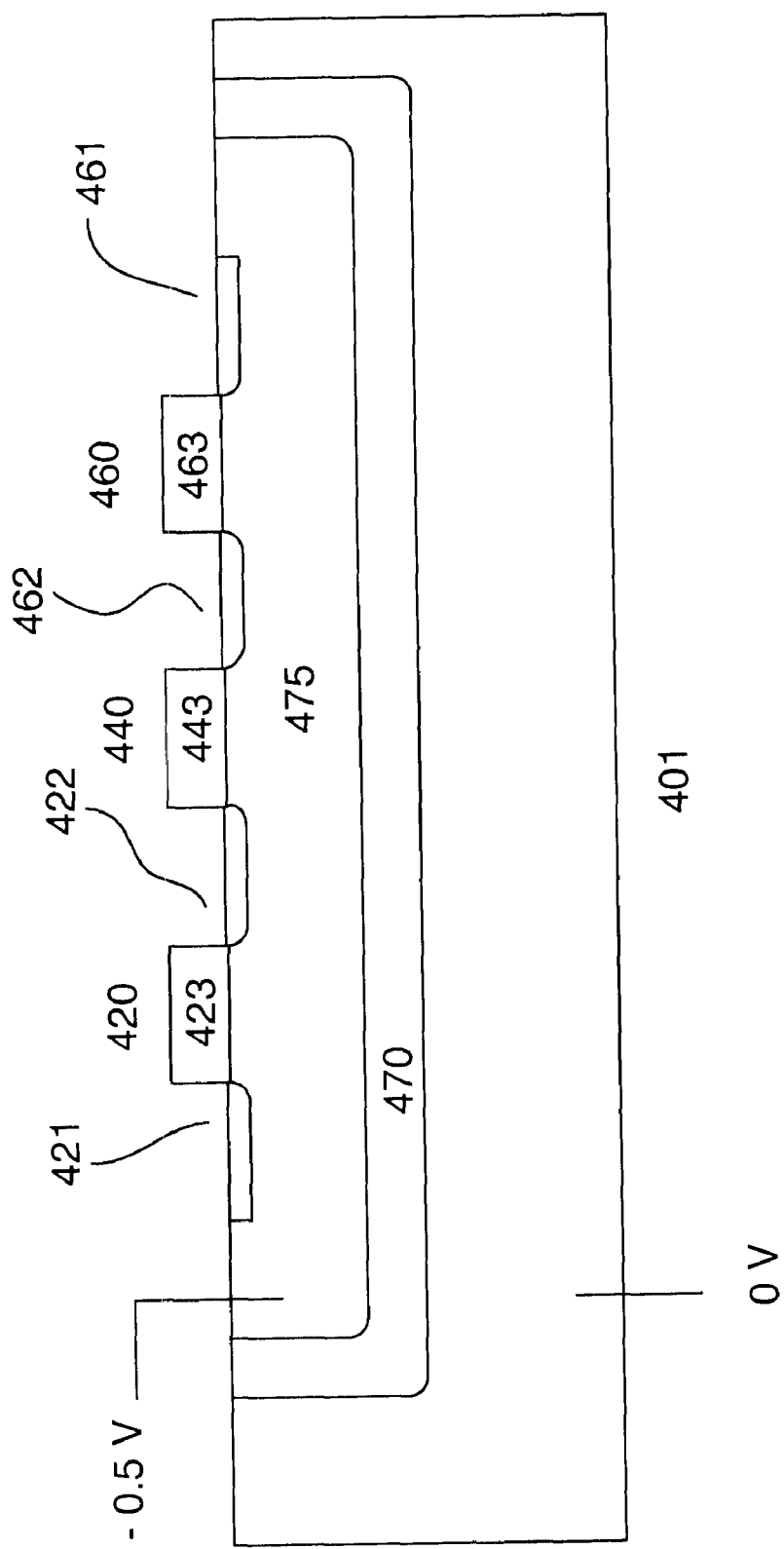
FIG. 4 shows a cross-section of a memory cell in accordance with one embodiment of the invention.

FIG. 4 shows a cross-section of a memory cell in accordance with one embodiment of the invention. A semiconductor substrate 401 is provided on which the memory cell is formed. Typically, the substrate is lightly doped with p-type dopants and is coupled to ground or $V_{SS}$. The memory cell comprises first, second, and third transistors 420, 440, and 460, each having a gate and first and second diffusion regions. The transistors comprise, in one embodiment, n-FETs formed on a heavily doped p-well 475. The layout of the memory cell, for example, is described in parent patent application titled: "Layout for a SemiConductor Memory", U.S. Ser. No. 09/615,987 which is herein incorporated by reference for all purposes.

The first and third transistors serve as access ports and the second transistor serve as a storage node. A gate 423 of the first transistor is coupled to a first word line and a gate 463 of transistor 460 is coupled to a second word line. Diffusion regions 421 and 461 of the first and third transistors are respectfully coupled to first and second bit lines. Second diffusion regions 422 and 462 of the first and second transistors are shared with the second transistor. A gate 443 of the transistor is coupled to a voltage supply. In one embodiment, the voltage supply is equal to or greater than about $V_{DD}$ and preferably equal to or greater than $V_{DD}+V_T$. More preferably, the voltage supply is equal to about $V_{DD}+V_T+\Delta V$ to ensure that the storage transistor operates in the inversion region.

To provide a negative off-state voltage to the access transistors, the p-well 475 is biased at a voltage less than $V_{SS}$. In one embodiment, the p-well is biased with about 0 to −0.9V, preferably about −0.4 to −0.6V, and more preferably about −0.5V. A heavily doped n-well is provided to isolate the substrate from the p-well. Biasing the p-well with the negative voltage advantageously reduces the leakage current from the storage transistor.

Figure 5:
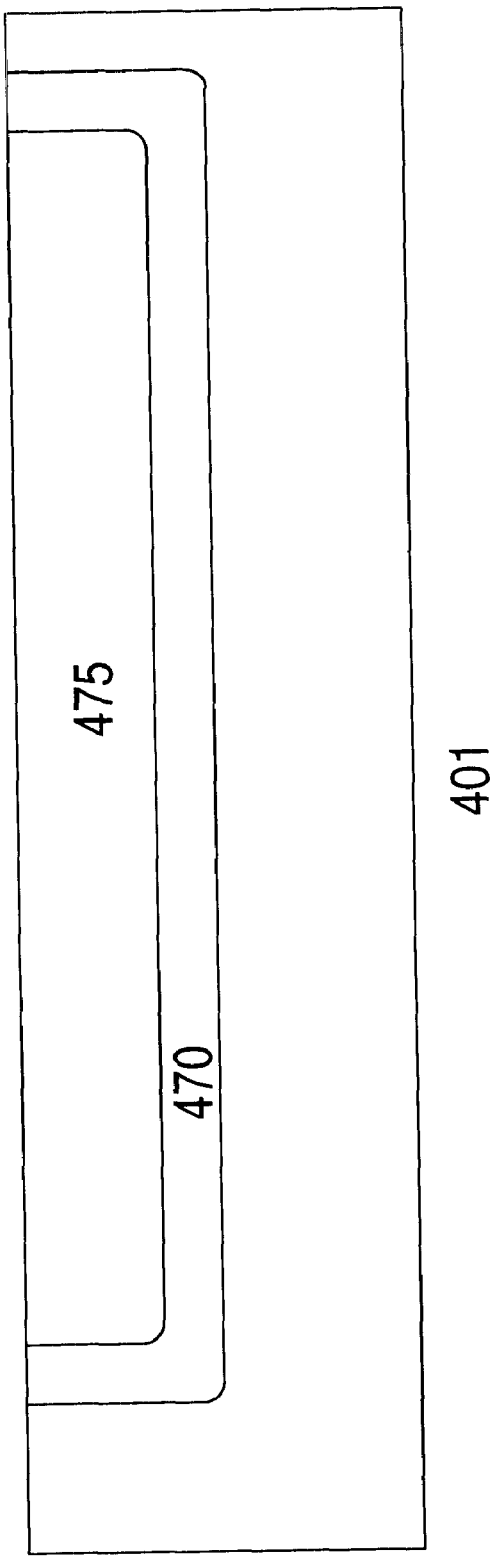
FIGS. 5–7 show a process of forming a memory cell in accordance with one embodiment of the invention.
Figure 6:
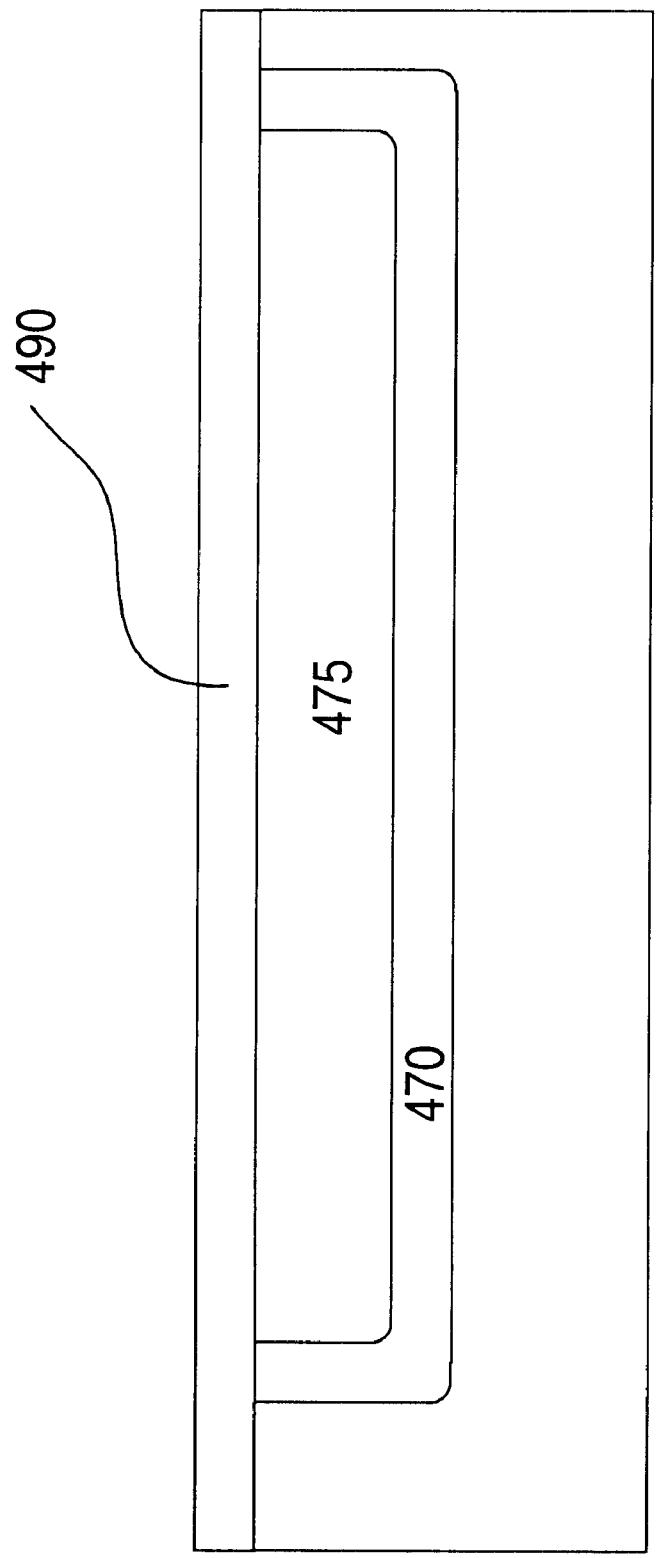
Figure 7:
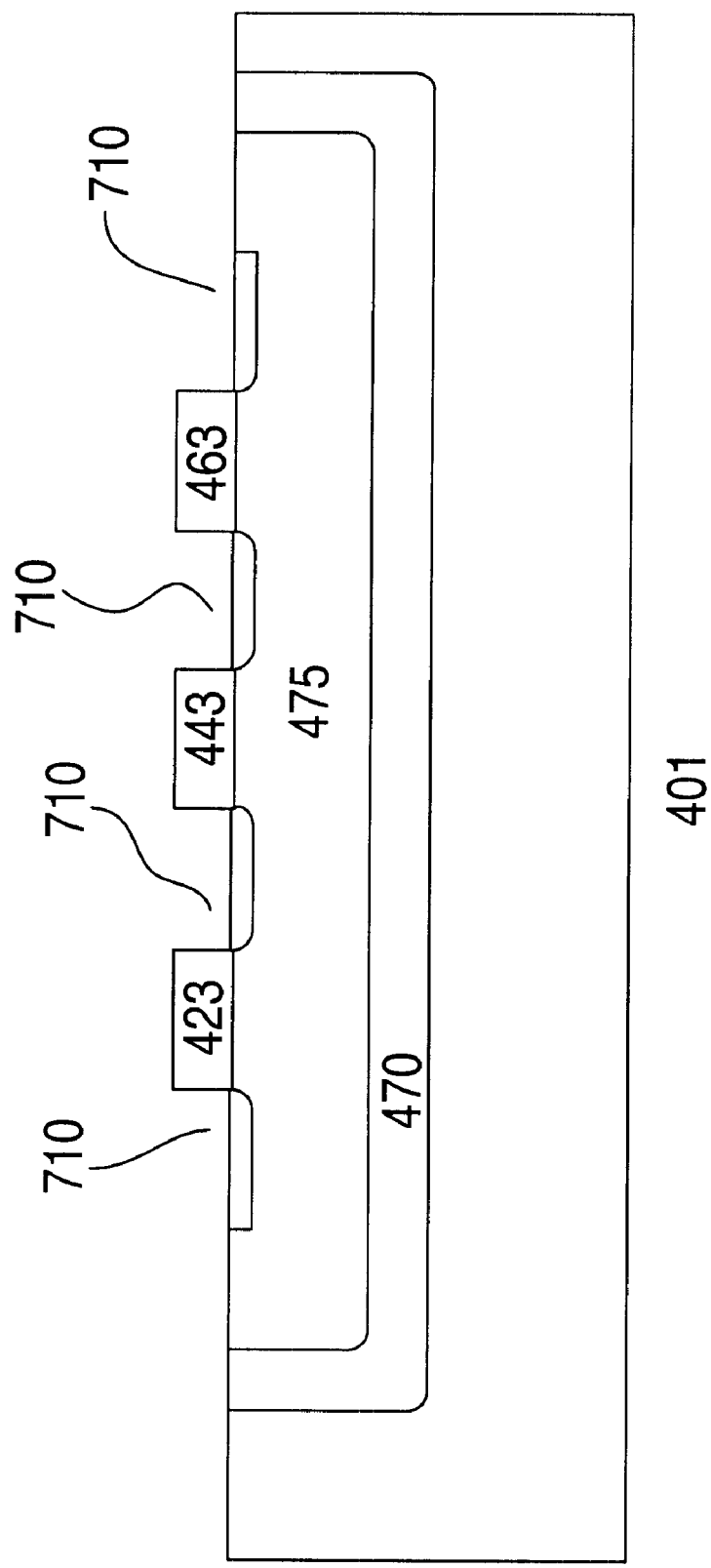

FIG. 5–7 show a process for forming the memory cell in accordance with one embodiment of the invention. As shown, a semiconductor substrate 401 is provided. The substrate, for example, comprises silicon. Other types of semiconductor substrates are also useful. Typically, the substrate is lightly doped with p-type dopants. In one embodiment, a first selective implant is performed with n-type dopants to form an n-well followed by a second implant with p-type dopants to form a heavily doped p-well 475 within the n-well. As a result, an n-type diffusion region 470 surrounds the p-well, isolating the p-well from the other parts of the substrate.

Referring to FIG. 6, an implant can be performed to tailor the surface dopant profile to achieve the desired $V_T$ for the transistors of the memory cell. The various layers of the gate stack 490, such as gate oxide and poly are formed on substrate. Additional layers, such as a silicide and a nitride cap layer can also be included.

Referring to FIG. 7, the gate layers are then selectively etched to form the gates 423, 443, and 463. Diffusion regions 710 of the transistors are then formed by, for example, ion implantation. Other techniques, such as diffusion, are also useful to form the diffusion regions. Additional processing is then performed to complete the memory cell. Such additional processing includes, for example, forming interlevel dielectric layers, contacts, bit lines, word lines, and final passivation.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A memory cell comprising:

first and second access transistors, each with a gate and first and second terminals;

first and second bit lines, the first bit line coupled to the first terminal of the first access transistor and the second bit line coupled to the first terminal of the second transistor;

first and second word lines, the first word line coupled to the first access transistor and the second word line coupled to the second access transistor;

a storage transistor having a gate and first and second terminals, the first and second terminals respectively coupled to the second terminals of the first and second access transistors; and wherein the first and second word lines comprise a negative voltage in an inactive state.

2. The memory cell of claim 1 wherein the first access transistor serves as an access port.

3. The memory cell of claim 2 wherein the first word line is coupled to the gate of the first access transistor and the second word line is coupled to the gate of the second access transistor.

4. The memory cell of claim 2 wherein the second access transistor serves as a dedicated refresh port.

5. The memory cell of claim 4 wherein the first word line is coupled to the gate of the first access transistor and the second word line is coupled to the gate of the second access transistor.

6. The memory cell of claim 1 wherein the first and second access transistors serve as first and second access ports.

7. The memory cell of claim 6 wherein the first word line is coupled to the gate of the first access transistor and the second word line is coupled to the gate of the second access transistor.

8. The memory cell of claim 1 wherein the first word line is coupled to the gate of the first access transistor and the second word line is coupled to the gate of the second access transistor.

9. A memory cell comprising:

first and second access transistors, each with a gate and first and second terminals;

first and second bit lines, the first bit line coupled to the first terminal of the first access transistor and the second bit line coupled to the first terminal of the second transistor;

first and second word lines, the first word line coupled to the first access transistor and the second word line coupled to the second access transistor;

a storage transistor having a gate and first and second terminals, the first and second terminals respectively coupled to the second terminals of the first and second access transistors; and wherein the first and second word lines comprise a negative voltage in an inactive state and a voltage greater than $V_{DD}$ in an active state.

10. The memory cell of claim 9 wherein the first access transistor serves as an access port.

11. The memory cell of claim 10 wherein the first word line is coupled to the gate of the first access transistor and the second word line is coupled to the gate of the second access transistor.

12. The memory cell of claim 10 wherein the second access transistor serves as a dedicated refresh port.

13. The memory cell of claim 12 wherein the first word line is coupled to the gate of the first access transistor and the second word line is coupled to the gate of the second access transistor.

14. The memory cell of claim 9 wherein the first and second access transistors serve as first and second access ports.

15. The memory cell of claim 14 wherein the first word line is coupled to the gate of the first access transistor and the second word line is coupled to the gate of the second access transistor.

16. The memory cell of claim 9 wherein the first word line is coupled to the gate of the first access transistor and the second word line is coupled to the gate of the second access transistor.

17. The memory cell of any of claims 9–16 wherein the word lines comprise a voltage equal or greater than about $V_{DD}+V_T$ in an active state.

18. The memory cell of claim 17 wherein the word lines comprise a voltage about $V_{DD}+V_T+\Delta V$ in an active state.

19. The memory cell of claim 18 wherein $\Delta V$ is about 0.1 to 0.3V.

20. A memory cell comprising:

first and second access transistors, each with a gate and first and second terminals;

first and second bit lines, the first bit line coupled to the first terminal of the first access transistor and the second bit line coupled to the first terminal of the second transistor;

first and second word lines, the first word line coupled to the first access transistor and the second word line coupled to the second access transistor;

a storage transistor having a gate and first and second terminals, the first and second terminals respectively coupled to the second terminals of the first and second access transistors; and wherein the first and second word lines comprise a negative voltage in an inactive state, wherein the negative voltage is less than 0V to about –0.9 V.

21. The memory cell of claim 20 wherein the negative voltage is about –0.4V to –0.6V.

22. The memory cell of claim 21 wherein the word lines comprise a voltage greater than $V_{DD}$ in an active state.

23. The memory cell of claim 22 wherein the word lines comprise a voltage equal or greater than about $V_{DD}+V_T$ in an active state.

24. The memory cell of claim 23 wherein the word lines comprise a voltage about $V_{DD}+V_T+\Delta V$ in an active state.

25. The memory cell of claim 20 wherein the negative voltage is about –0.5V.

26. The memory cell of claim 20 wherein the word lines comprise a voltage greater than $V_{DD}$ in an active state.

27. The memory cell of claim 26 wherein the word lines comprise a voltage equal or greater than about $V_{DD}+V_T$ in an active state.

28. The memory cell of claim 27 wherein the word lines comprise a voltage about $V_{DD}+V_T+\Delta V$ in an active state.

29. The memory cell of any of claims 20–28 wherein the first access transistor serves as an access port.

30. The memory cell of claim 29 wherein the first word line is coupled to the gate of the first access transistor and the second word line is coupled to the gate of the second access transistor.

31. The memory cell of claim 29 wherein the second access transistor serves as a dedicated refresh port.

32. The memory cell of claim 31 wherein the first word line is coupled to the gate of the first access transistor and the second word line is coupled to the gate of the second access transistor.

* * * * *